(12) United States Patent
Matsunaga

(10) Patent No.: US 8,921,928 B2
(45) Date of Patent: Dec. 30, 2014

(54) SEMICONDUCTOR DEVICE WITH LOW ON RESISTANCE

(75) Inventor: Shinichiro Matsunaga, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 172 days.

(21) Appl. No.: 13/099,119

(22) Filed: May 2, 2011

(65) Prior Publication Data
US 2011/0204437 A1 Aug. 25, 2011

Related U.S. Application Data

(62) Division of application No. 12/232,989, filed on Sep. 26, 2008, now abandoned.

(30) Foreign Application Priority Data

Sep. 27, 2007 (JP) .................. 2007-251410

(51) Int. Cl.
*H01L 29/78* (2006.01)
*H01L 29/417* (2006.01)
*H01L 29/423* (2006.01)
*H01L 29/66* (2006.01)
*H01L 21/265* (2006.01)
*H01L 29/45* (2006.01)

(52) U.S. Cl.
CPC ...... *H01L 29/41766* (2013.01); *H01L 29/4236* (2013.01); *H01L 29/66659* (2013.01); *H01L 29/7835* (2013.01); *H01L 21/26586* (2013.01); *H01L 29/456* (2013.01); *H01L 29/66787* (2013.01)

USPC ............................................... 257/330

(58) Field of Classification Search
CPC .............. H01L 29/4238; H01L 29/41766; H01L 29/66787; H01L 29/7825; H01L 29/66674; H01L 29/41741
USPC ........................................... 257/330–332
See application file for complete search history.

(56) References Cited

U.S. PATENT DOCUMENTS

| | | |
|---|---|---|
| 6,469,349 B2 | 10/2002 | Murakami et al. |
| 6,649,455 B2 | 11/2003 | Murakami et al. |
| 6,921,942 B2 | 7/2005 | Murakami et al. |
| 2003/0141514 A1 | 7/2003 | Yamaguchi et al. |
| 2004/0089896 A1 | 5/2004 | Sakakibara |
| 2007/0063195 A1 | 3/2007 | Kim et al. |

FOREIGN PATENT DOCUMENTS

| | | |
|---|---|---|
| JP | 51-147269 | 12/1976 |
| JP | 2001-274398 | 10/2001 |
| JP | 2002-026311 | 1/2002 |
| JP | 2005-136150 | 5/2005 |
| JP | 2006-216863 | 8/2006 |

*Primary Examiner* — Shaun Campbell
*Assistant Examiner* — Raj R Gupta
(74) *Attorney, Agent, or Firm* — Rabin & Berdo, P.C.

(57) ABSTRACT

A semiconductor device having a low on resistance and high integration level with respect to the surface area of a substrate is provided. In the semiconductor device, a first trench, a second trench, and a third trench are provided in an element formation region provided on a semiconductor substrate. Metal is deposited within the first trench and second trench, to form a drain electrode and a source electrode, respectively. Polysilicon is deposited inside the third trench with a gate insulating film intervening, and a gate electrode is formed.

9 Claims, 16 Drawing Sheets

SEMICONDUCTOR DEVICE WITH LOW ON RESISTANCE

CROSS-REFERENCE TO RELATED APPLICATION

This is a divisional application of co-pending U.S. application Ser. No. 12/232,989, filed Sep. 26, 2008, the disclosure of which is incorporated herein by reference. This application is based on, and claims priority to, Japanese Patent Application No. 2007-251410 filed on Sep. 27, 2007.

BACKGROUND OF THE INVENTION

1. Field of the Invention

This invention relates to a semiconductor device and to a manufacturing method of a semiconductor device, and in particular relates to a MOSFET with a three-dimensional structure in which a MOS structure portion is formed in a direction perpendicular to a semiconductor substrate.

2. Description of the Related Art

In the prior art, horizontal-type MOSFETs (Metal Oxide Semiconductor Field Effect Transistors), formed in a planar manner on a substrate, and TFTs (Thin Film Transistors), in which silicon is evaporation-deposited on a substrate, are well-known. MOSFETs and TFTs have evolved, accompanying demands for device miniaturization, with smaller element pitches through reduced gate lengths (hereafter "L lengths"), as well as the ability to pass larger currents by increasing gate widths (hereafter "W lengths"). Here the gate length is the length of the gate electrode in the direction in which carriers move between source and drain, and the gate width is the length of the gate electrode in the direction perpendicular to the gate length.

However, because of the need to secure a breakdown voltage for the element, there are limits to the extent to which the L length can be reduced. And, in a planar-structure device there is a limit to the extent to which the W length can be increased. On the other hand, among discrete type MOSFETs, vertical type MOSFETs are known in which the drain and source are formed above and below the substrate, and current flows perpendicularly to the substrate.

Further, a trench lateral power MOSFET (TPLM) is known, in which a gate electrode is formed on a trench side wall, and current flows from the upper face of the substrate toward the trench bottom face (for example, see Japanese Patent Laid-open No. 2006-216863). FIG. 16 is an explanatory diagram showing the cross-sectional structure of a trench lateral power MOSFET. As shown in FIG. 16, the trench lateral power MOSFET 1600 is provided with an n-type well region 1602 in the surface region of a p-type semiconductor substrate 1601. A trench 1605 is formed from the substrate surface in the well region 1602. And, an n-type extended drain region 1603 to serve as a drift region is formed so as to surround the bottom portion of the trench 1605.

A high-concentration n-type drain region 1606 is provided in the substrate surface layer on the side of the trench 1605. Between the n-type drain region 1606 and the extended drain region 1603 is provided an n-type offset region 1608. And, on the opposite side of the trench 1605 from the n-type drain region 1606 is provided a p-type offset region 1604 to serve as the channel region, in contact with the extended drain region 1603. In the substrate surface layer of the offset region 1604 is provided a high-concentration n-type source region 1607, in contact with the trench 1605.

Further, in the trench 1605, on the side wall on the side in contact with the offset region 1604, are provided a gate oxide film 1613 to become the gate insulating film and a gate polysilicon electrode 1611 to serve as the gate electrode. In the trench 1605, on the side wall on the side in contact with the n-type drain region 1606, are provided a field plate oxide film 1614 to serve as a field plate insulating film and a field plate 1612. And, an interlayer insulating film 1615 fills between the gate polysilicon electrode 1611 and the field plate 1612.

In a trench-type MOSFET, the structure in the length direction of an ordinary MOSFET is formed perpendicularly to the substrate. Consequently in a trench-type MOSFET the element pitch can be made small compared with an ordinary MOSFET, so that the W length of the entire element can be increased. Also, because the current flowing in the element is proportional to the W length, in a trench lateral MOSFET the on resistance can be made smaller.

If it were possible to form an element with a structure in which the W length was extended in the substrate interior direction, then the W length of the overall element could be made markedly longer, and a device with a low on resistance could be formed. Based on this concept, MOSFETs with three-dimensional structures, such as Fin-gate MOSFETs and similar devices, have been developed (see for example Japanese Patent Laid-open No. 51-147269, Japanese Patent Laid-open No. 2005-136150 (corresponding to U.S. Pat. No. 6,921,942 B2), and Japanese Patent Laid-open No. 2002-26311 (corresponding to U.S. Pat. No. 6,469,349 B2 and one other)).

For example, in the case of a 20 V-class device, the pitch of a planar DMOSFET is 4 μm, and the pitch of a trench lateral power MOSFET is 2.5 μm. On the other hand, in the case of MOSFETs with a three-dimensional structure, if the two dimensions along the substrate surface are the X direction and the Y direction, and the substrate internal direction is the Z direction, then the pitch in the X direction is the same 4 μm as for a planar device, and the pitch in the Y direction is 1.5 μm. The Y-direction pitch is smaller than the pitch for a trench lateral power MOSFET because there is no need to perform ion implantation to form the source region and drain region. In this case, if the drain-gate depth (Z-direction dimension) is 1.5 μm, then the W length is the same as for a planar device. And, if the trench gate depth is 2.4 μm, then the W length is the same as for a trench lateral power MOSFET. Hence if the trench gate depth is 5 μm, then a W length twice that of a trench lateral power MOSFET can be secured.

However, a Fin gate MOSFET requires that accurate patterning be performed within the trench, and there is the problem that as the trench aspect ratio rises, fine device formation becomes impossible. Further, in order to increase the device W length, a deep trench must be formed; but in order to keep the aspect ratio from becoming high, the trench width must also be made broad. As a result, there is the problem that in a Fin gate MOSFET the density of the MOS structure which can be formed on trench side walls is decreased, and the area efficiency is worsened.

SUMMARY OF THE INVENTION

In order to resolve the above-described problems of the prior art, this invention has as an object the provision of a semiconductor device with a low on resistance and high integration level with respect to the substrate surface area. Also, this invention has as an object the provision of a method for manufacturing semiconductor devices with a low on resistance and high integration level with respect to the substrate surface area, without accompanying complex processes.

In order to resolve the above-described problems and attain these objects, in one aspect of a semiconductor device according to the invention, a first trench is provided in a semiconductor region of a first conduction type, and a drain electrode, formed from metal, is provided within the first trench. On the periphery of the first trench is formed a drain region of a second conduction type, and on the periphery of the drain region is formed a drift region of the second conduction type, with an impurity concentration lower than that of the drain region. In the first-conduction-type semiconductor region, is provided a second trench so as to be parallel to the first trench; within the second trench is provided a source electrode, formed from metal; and on the periphery of the second trench is formed a source region of the second conduction type. Also, in the first-conduction-type semiconductor region is provided a third trench, perpendicular to the first trench and second trench. The third trench is in contact with the drift region and with the source region. Within the third trench is provided a gate electrode, formed from polysilicon with an insulating film intervening. On the surface of the first-conduction-type semiconductor region is provided a pickup region of the first conduction type, removed from the drift region and source region. A plurality of gate electrodes and pickup regions may be provided, alternately.

Further, in a semiconductor device manufacturing method for manufacturing the semiconductor device according to the above-mentioned aspect of the invention, first, a first trench and a second trench are formed with substantially the same width and in parallel in a semiconductor region of a first conduction type, and a third trench of width narrower than that of the first trench and second trench, is formed perpendicularly to the first trench and second trench. Next, an insulating film is formed on a side wall of the first trench, on a side wall of the second trench, and on a side wall of the third trench. Then, polysilicon is deposited so as to cover the insulating film formed on the side wall of the first trench and the side wall of the second trench, and so as to fill the interior of the third trench. Then, the insulating film and the polysilicon on the side wall of the first trench and on the side wall of the second trench are removed, the insulating film and the polysilicon on the periphery of an aperture portion of the third trench are removed, and a gate insulating film and a gate electrode are formed within the third trench. Then metal is deposited within the first trench and the second trench, and a drain electrode is formed within the first trench and a source electrode is formed within the second trench.

Further, in another semiconductor device manufacturing method for manufacturing a semiconductor device according to the above-mentioned aspect of the invention, first, a first trench and a second trench are formed with substantially the same width and in parallel in a semiconductor region of a first conduction type, and a third trench of width narrower than that of the first trench and second trench, is formed perpendicularly to the first trench and second trench. Next, a drift region is formed, in contact with the third trench, along the periphery of the side wall of the first trench within the first-conduction-type semiconductor region. Then, after forming an insulating film on the side wall of the first trench, the side wall of the second trench, and the side wall of the third trench, polysilicon is deposited so as to cover the insulating film formed on the side wall of the first trench and the side wall of the second trench, and so as to fill the interior of the third trench. Then, the insulating film and the polysilicon on the side wall of the first trench and side wall of the second trench are removed, and the insulating film and the polysilicon on the periphery of an aperture portion of the third trench are removed, and in addition a gate insulating film and a gate electrode are formed within the third trench. Next, a drain region of a second conduction type is formed along the periphery of the first trench within the first-conduction-type semiconductor region, and a source region of the second conduction type is formed along the periphery of the side wall of the second trench. Then, a pickup region of the first conduction type is formed, removed from the drift region and source region, in a region of the surface of the first-conduction-type semiconductor region in which the third trench is not formed. Finally, metal is deposited within the first trench and second trench, and a drain electrode is formed within the first trench and a source electrode is formed within the second trench.

In the process of formation of the drift region in the above-described other manufacturing method, the region other than the aperture portion of the first trench may be masked, impurities of the second conduction type may be implanted from the perpendicular direction and oblique directions into the aperture portion of the first trench, and heat treatment may be performed to form the drift region. Also, in the process of formation of the drain region and source region, the region other than the aperture portions of the first trench and second trench may be masked, impurities of the second conduction type may be implanted from the perpendicular direction and oblique directions into the aperture portions of the first trench and second trench, and heat treatment may be performed to form the drain region and source region.

In another aspect of a semiconductor device according to the invention, the semiconductor device comprises a first trench, provided in a semiconductor region of a first conduction type, a drain electrode, formed within the first trench, a second trench, provided in the semiconductor region of the first conduction type, and a source electrode, formed within the second trench. The semiconductor device further comprises a third trench narrower than the first trench and second trench, provided in the semiconductor region of the first conduction type, and in contact with a drift region associated with the first trench and a source region associated with the second trench and a gate electrode, formed within the third trench.

The semiconductor device according to the above-described other aspect may further comprise a drain region of a second conduction type, formed on a periphery of the first trench. The drift region may be of the second conduction type, be formed on the periphery of the drain region, and have an impurity concentration lower than that of the drain region. The second trench may be parallel with the first trench, and the third trench may be perpendicular to the first trench and the second trench. In the semiconductor device, the source region may be of the second conduction type, and formed on a periphery of the second trench. The semiconductor device may further comprise a pickup region of the first conduction type, provided on a surface of the semiconductor region of the first conduction type, and removed from the drift region and the source region. The gate electrode may be formed of polysilicon, and the drain electrode and the source electrode may be formed from metal. A plurality of the gate electrodes and a plurality of the pickup regions may be provided alternately.

By means of a semiconductor device of this invention, there is the advantageous result that a semiconductor device can be obtained having a low on resistance and high integration level with respect to the substrate surface area. Further, by means of a semiconductor device manufacturing method of this invention, a semiconductor device having a low on resistance and high integration level with respect to the substrate surface area can be manufactured, without accompanying complex processes.

DESCRIPTION OF THE PREFERRED EMBODIMENTS

Below, structures of a semiconductor device and operations of a semiconductor device manufacturing method according to the invention are explained in detail, referring to the attached drawings.

Figure 1:
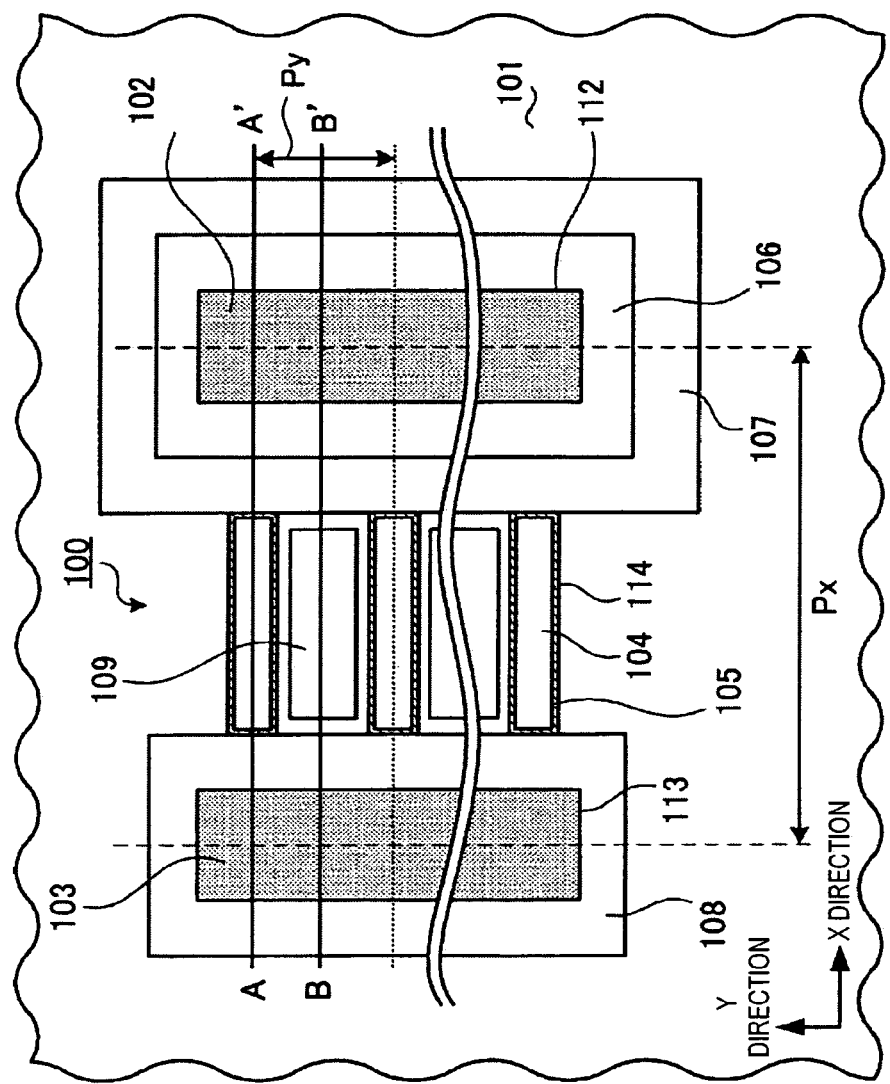
FIG. 1 is a plan view showing the structure of the semiconductor device according to the invention.
Figure 2:
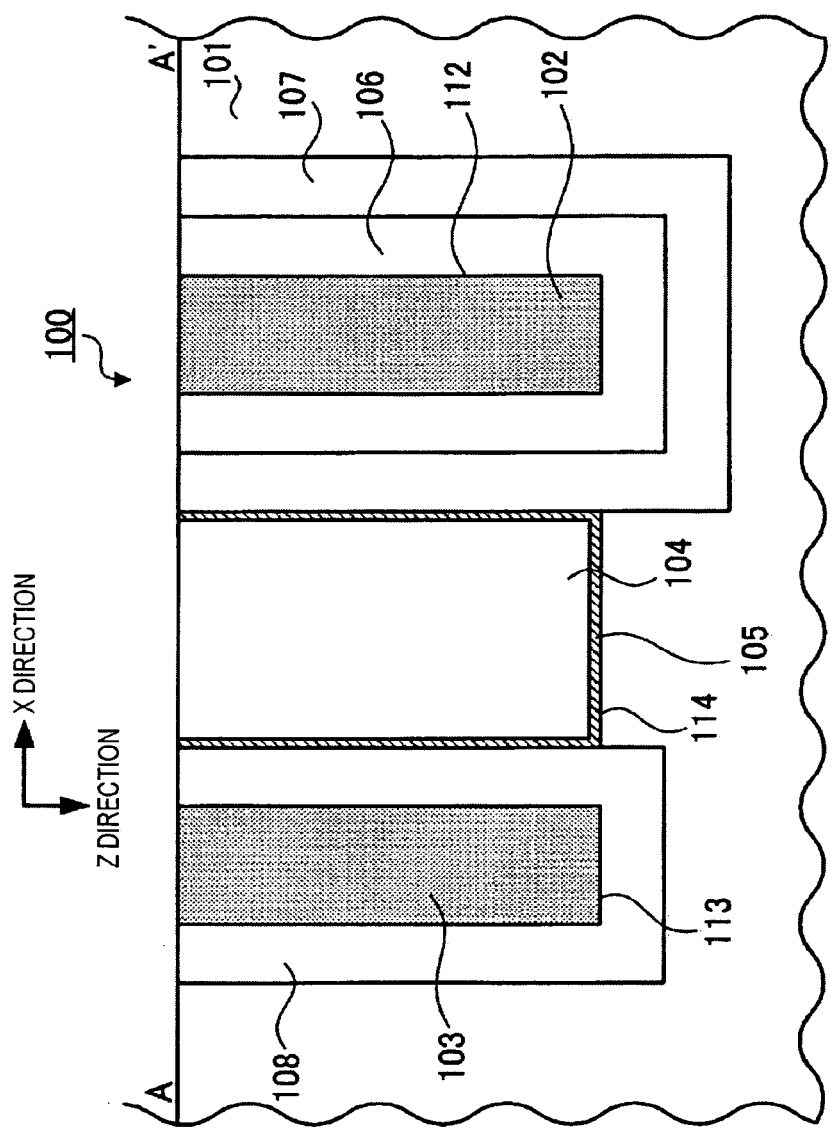
FIG. 2 is a cross-sectional view along the direction of the line segment A-A' in FIG. 1.
Figure 3:
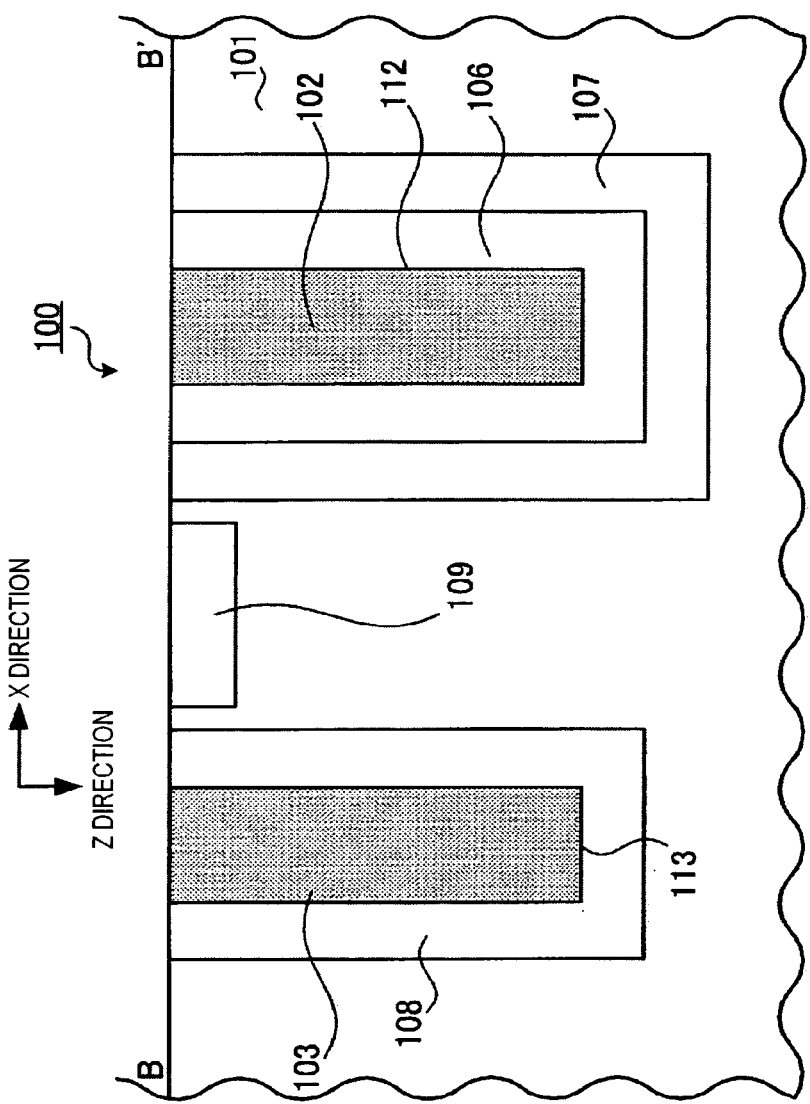
FIG. 3 is a cross-sectional view along the direction of the line segment B-B' in FIG. 1.
Figure 4:
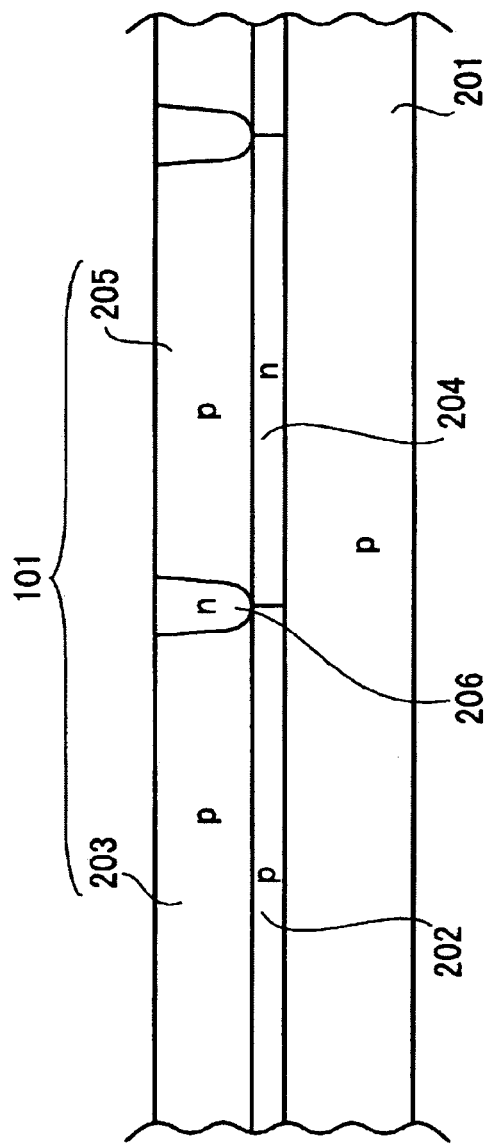
FIG. 4 is an explanatory diagram showing a stage of a semiconductor device manufacturing process for manufacturing the semiconductor device according to the invention as shown in FIGS. 1-3.

FIG. 1 is a plan view showing the structure of the semiconductor device according to the invention. FIG. 2 is a cross-sectional view in the direction along line segment A-A' in FIG. 1, and FIG. 3 is a cross-sectional view in the direction along line segment B-B' in FIG. 1. The semiconductor device 100 is an n-channel MOSFET with a three-dimensional structure. FIG. 4 is a cross-sectional view of the substrate on which the semiconductor device of the aspect is formed. In FIG. 1 to FIG. 3, an interlayer insulating film and metal wiring formed on the surface of the semiconductor device 100 are omitted.

As shown in FIG. 1 to FIG. 3, in the semiconductor device 100, a drain electrode 102 is formed within the trench 112 formed in the Y direction of the surface of the element formation region 101 (see FIG. 4) on a semiconductor substrate, and a source electrode 103 is formed within the trench 113 formed in the same Y direction. On the periphery of the drain electrode 102 is formed an $n^+$ drain region 106. Also, an $n^-$ drift region 107 is formed on the periphery of the $n^+$ drain region 106, and an $n^+$ source region 108 is formed on the periphery of the source electrode 103.

Also, a gate electrode 104 is formed, with a gate insulating film 105 intervening, within the trench 114 formed in the x direction of the surface of the element formation region 101. The trench 114 is in contact with the $n^-$ drift region 107 and $n^+$ source region 108. Also, a $p^+$ pickup region 109 is formed parallel to the trench 114 on the surface of the element formation region 101.

The pitch Px in the X direction of the semiconductor device 100 (the distance between the X direction center of the drain electrode 102 and the X direction center of the $n^+$ source electrode 103) is for example 4.5 μm. Also, the pitch Py in the Y direction of the semiconductor device 100 (the distance between Y direction centers of adjacent gate electrodes 104) is for example 1.5 μm.

More specifically, the width in the X direction of the trench 112 for the drain electrode 102 and of the trench 113 for the source electrode 103 is for example 1 μm. And, the width in the X direction of the trench 114 for the gate electrode 104 is for example 1.5 μm. The width in the Y direction of the trench 114 for the gate electrode 104 is for example 0.4 μm. And, the distance in the X direction between the trench 112 for the drain electrode 102 and the trench 114 for the gate electrode 104 is 1 μm. The distance in the X direction between the trench 113 for the source electrode 103 and the trench 114 for the gate electrode 104 is 1 μm.

As shown in FIG. 4, the semiconductor substrate on which the semiconductor device 100 is formed is prepared by forming, on the surface of a p-type semiconductor substrate 201, a first p epitaxial layer 203 with a p layer 202 intervening, and a second p epitaxial layer 205 with an n layer 204 intervening. An epitaxial layer is an epitaxially grown layer. The first p epitaxial layer 203 and second p epitaxial layer 205 are separated by an n-type separation region 206. The first p epitaxial layer 203 is a low-side p-type semiconductor region, and the second p epitaxial layer 205 is a high-side p-type semiconductor region. Hereafter, the first p epitaxial layer 203 and second p epitaxial layer 205 are together called the element formation region 101.

Next, processes in the manufacture of the semiconductor device 100 are explained. FIG. 4 to FIG. 15 are explanatory diagrams showing stages of the manufacturing processes. In FIG. 5 to FIG. 15, cross-sectional views along the line segment A-A' in FIG. 1 are called "A-A' cross-sectional views", and cross-sectional views along line segment B-B' in FIG. 1 are called "B-B' cross-sectional views".

First, as shown in FIG. 4, p-type impurities and n-type impurities are implanted from the surface of a p-type semiconductor substrate 201, to form a p layer 202 and an n layer 204. Next, epitaxial growth is used to form a first p epitaxial layer 203 and second p epitaxial layer 205 on the surfaces of the p layer 202 and n layer 204 respectively. Then, an n-type diffusion layer is used to form a separation region 206, enabling formation of a semiconductor substrate with the structure shown in FIG. 4.

The p layer 202 and n layer 204 may also be formed by first forming the first p epitaxial layer 203 and second p epitaxial layer 205 on the surface of the semiconductor substrate 201, and then implanting impurities from the surface of the first p epitaxial layer 203 and second p epitaxial layer 205. Also, the separation region 206 may also be formed by means of a trench or a diffusion layer formed within a trench.

Figure 5:
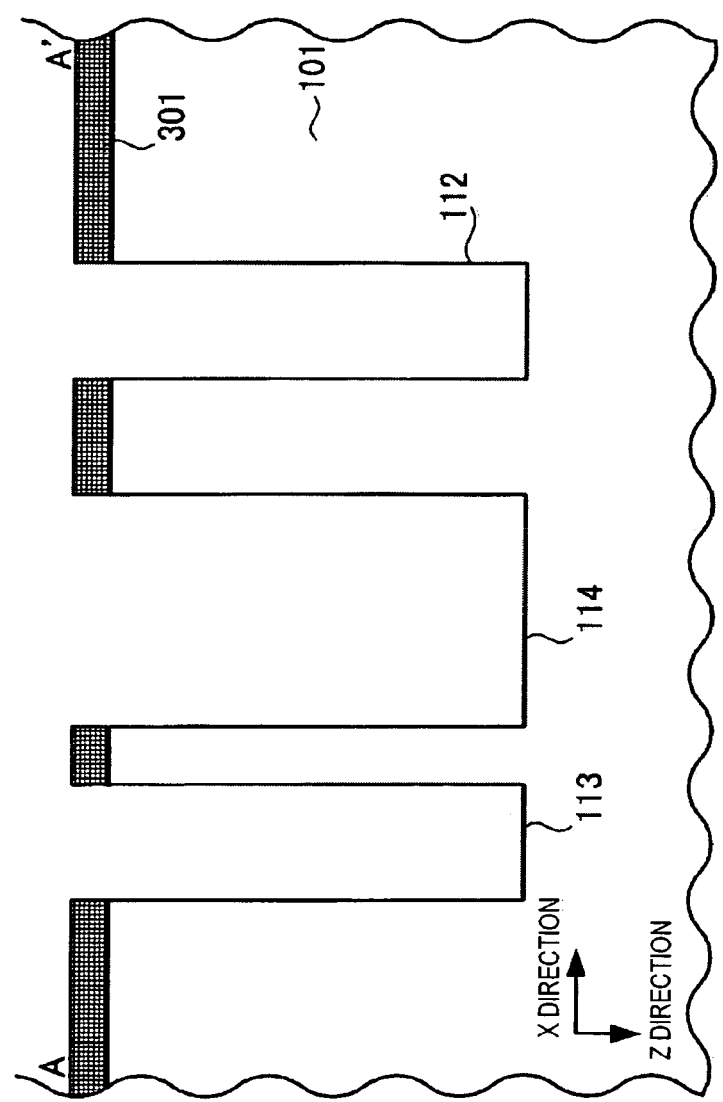
FIG. 5 is an explanatory diagram showing another stage of the semiconductor device manufacturing process.

Next, as shown in the A-A' cross-sectional view of FIG. 5, after forming a silicon oxide film 301 over the entire surface of the element formation region 101, patterning is performed to open regions in which to form the trenches 112 to 114. Then, using the silicon oxide film 301 as a mask, etching is performed to form the trenches 112 to 114. The depth of the trenches 112 to 114 (Z-direction distance) is for example 3 μm.

Figure 6:
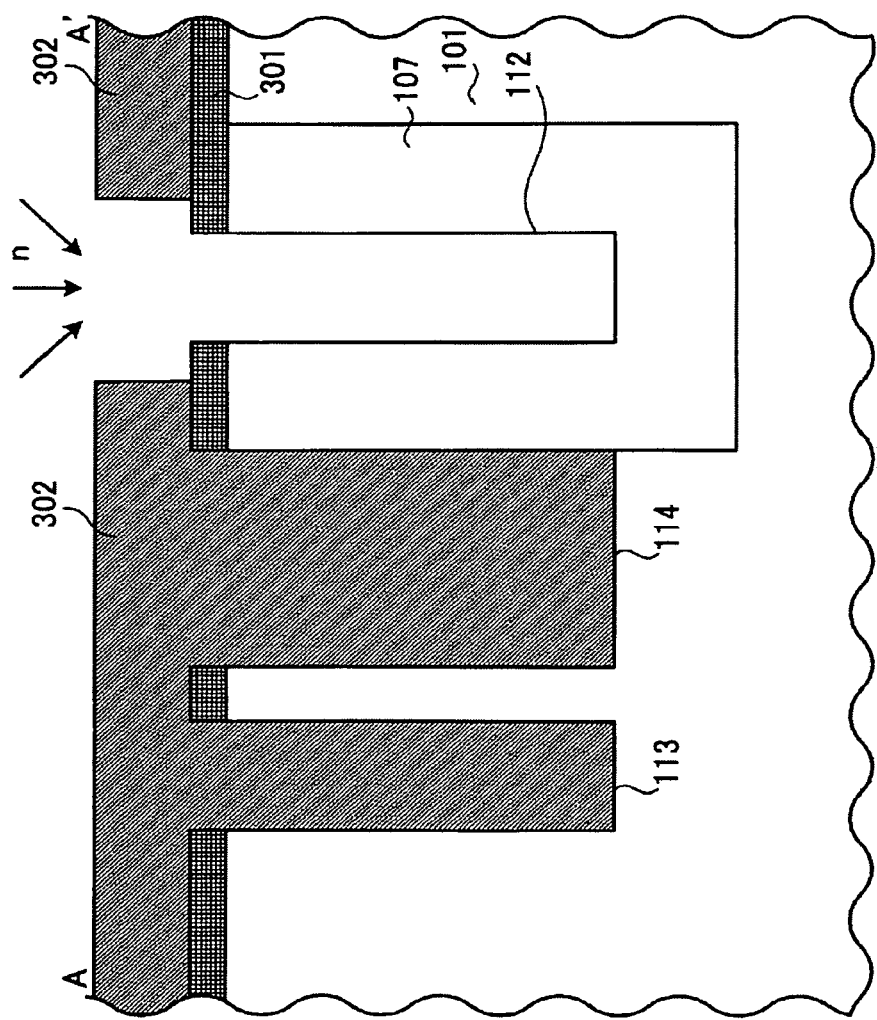
FIG. 6 is an explanatory diagram showing a still further stage of the semiconductor device manufacturing process.

Next, as shown in the A-A' cross-sectional view of FIG. 6, after applying resist 302 to the surface of the element formation region 101 and within the trenches 112 to 114, patterning is performed to remove resist 302 within the trench 112 for the drain electrode 102 and from the vicinity of the aperture portion of the trench 112. Then, using the resist 302 as a mask, n-type impurities are implanted, in the perpendicular direction and in oblique directions, within the trench 112. Then heat treatment is performed to form an $n^-$ drift region 107. At this time, the $n^-$ drift region 107 reaches an end portion of the trench 114 for the gate electrode 104.

Figure 7:
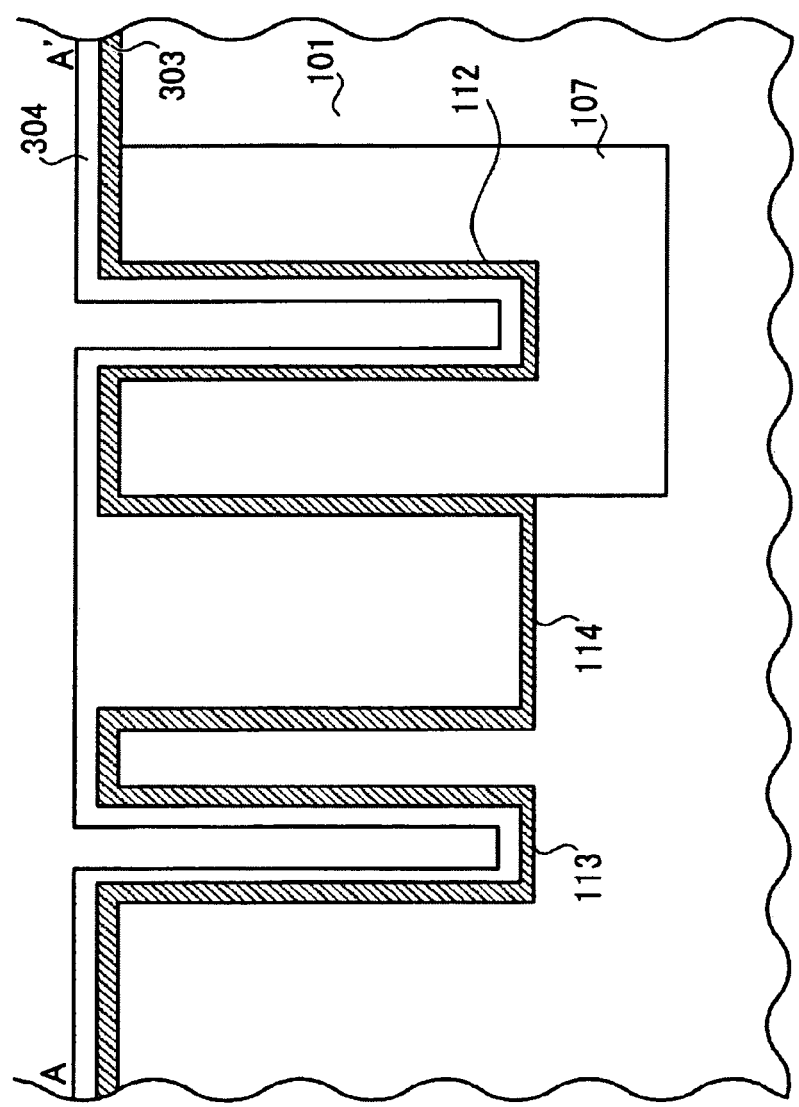
FIG. 7 is an explanatory diagram showing a still further stage of the semiconductor device manufacturing process.

Next, as shown in the A-A' cross-sectional view of FIG. 7, after removing silicon oxide film 301 and resist 302, a silicon oxide film 303 is formed on the surface of the element formation region 101 and the surfaces within the trenches 112 to 114. Then, polysilicon 304 is deposited onto the surface of the silicon oxide film 303. At this time, the interior of the trench 114 for the gate electrode 104 is completely filled with the polysilicon 304. On the other hand, the trench 112 for the drain electrode 102 and trench 113 for the source electrode 103 are not completely filled with the polysilicon 304, and spaces are left in the interiors thereof. This is achieved by setting the film thickness of the polysilicon 304 and the widths of the trenches 112 to 114 to appropriate values.

Figure 8:
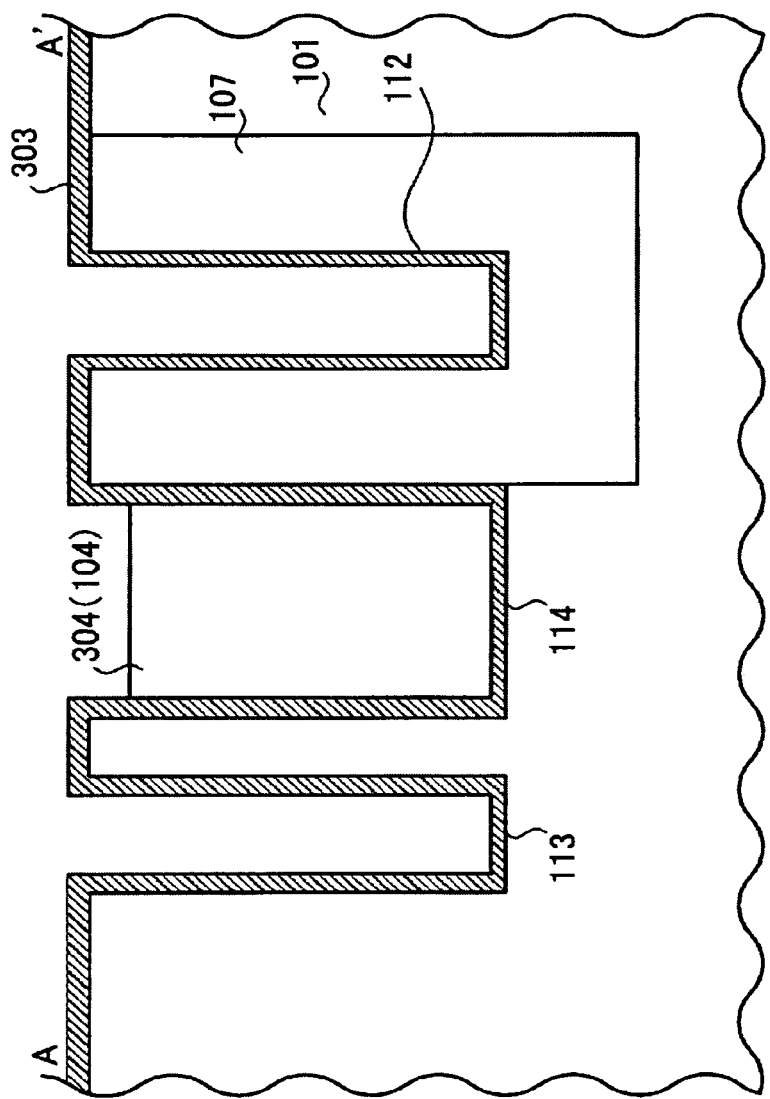
FIG. 8 is an explanatory diagram showing a still further stage of the semiconductor device manufacturing process.

Next, as shown in the A-A' cross-sectional view of FIG. 8, isotropic etching is performed to remove polysilicon 304. At this time, the polysilicon 304 deposited within the trench 112 for the drain electrode 102 and within the trench 113 for the source electrode 103 is completely removed. On the other hand, a portion of the upper portion (on the periphery of the aperture portion) of the polysilicon 304 deposited in the trench 114 for the gate electrode 104 is removed, but most of the polysilicon within the trench 114 is not removed. This is so that the interior of the trench 114 is completely filled with polysilicon 304 so that the surface area is reduced, and consequently the etching rate is slower compared with the polysilicon 304 in the trenches 112 and 113. Further, the polysilicon 304 remaining within the trench 114 becomes the gate electrode 104.

Figure 9:
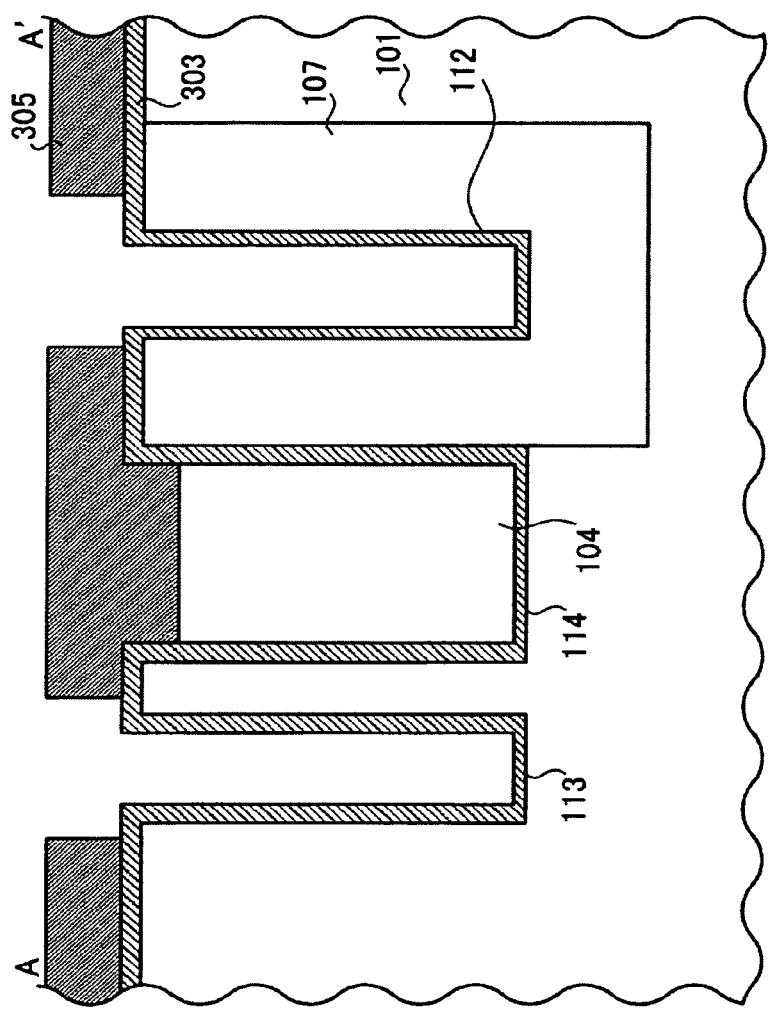
FIG. 9 is an explanatory diagram showing a still further stage of the semiconductor device manufacturing process.

Next, as shown in the A-A' cross-sectional view of FIG. 9, resist 305 is deposited on the surface of the element formation region 101. Then, patterning is performed to remove resist 305 within the trench 112 for the drain electrode 102 and on the periphery of the aperture portion thereof, and within the trench 113 for the source electrode 103 and on the periphery of the aperture portion thereof.

Figure 10:
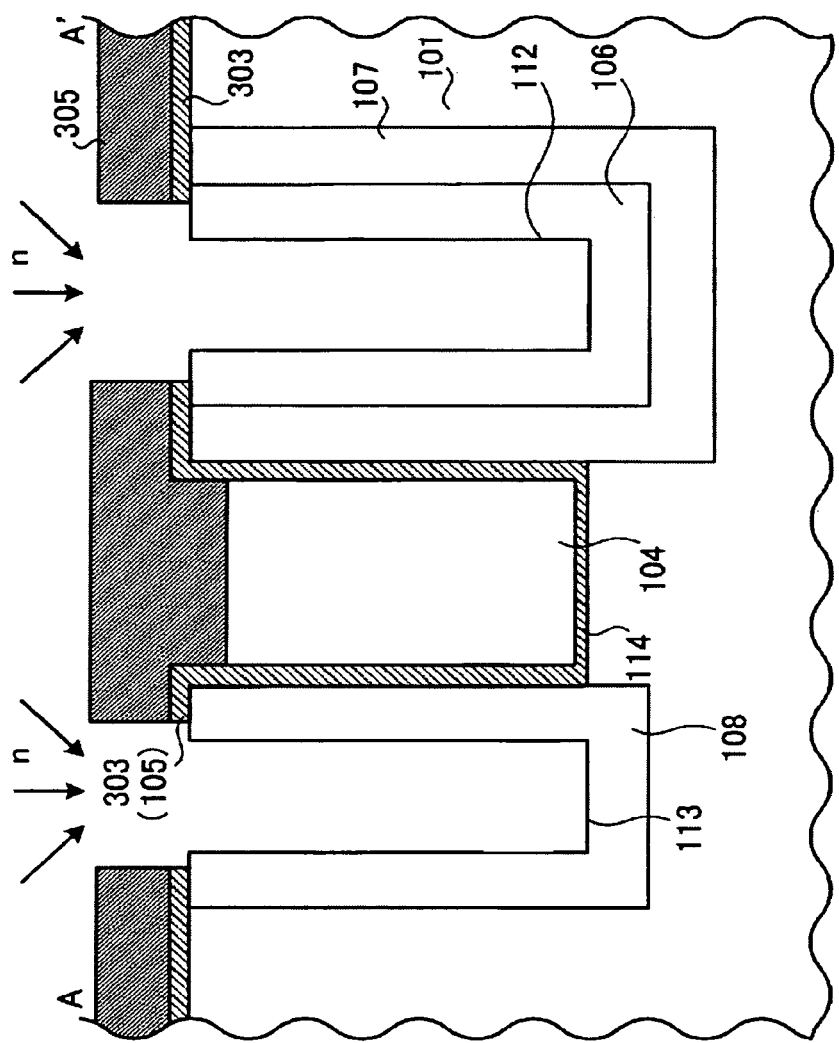
FIG. 10 is an explanatory diagram showing a still further stage of the semiconductor device manufacturing process.
Figure 11:
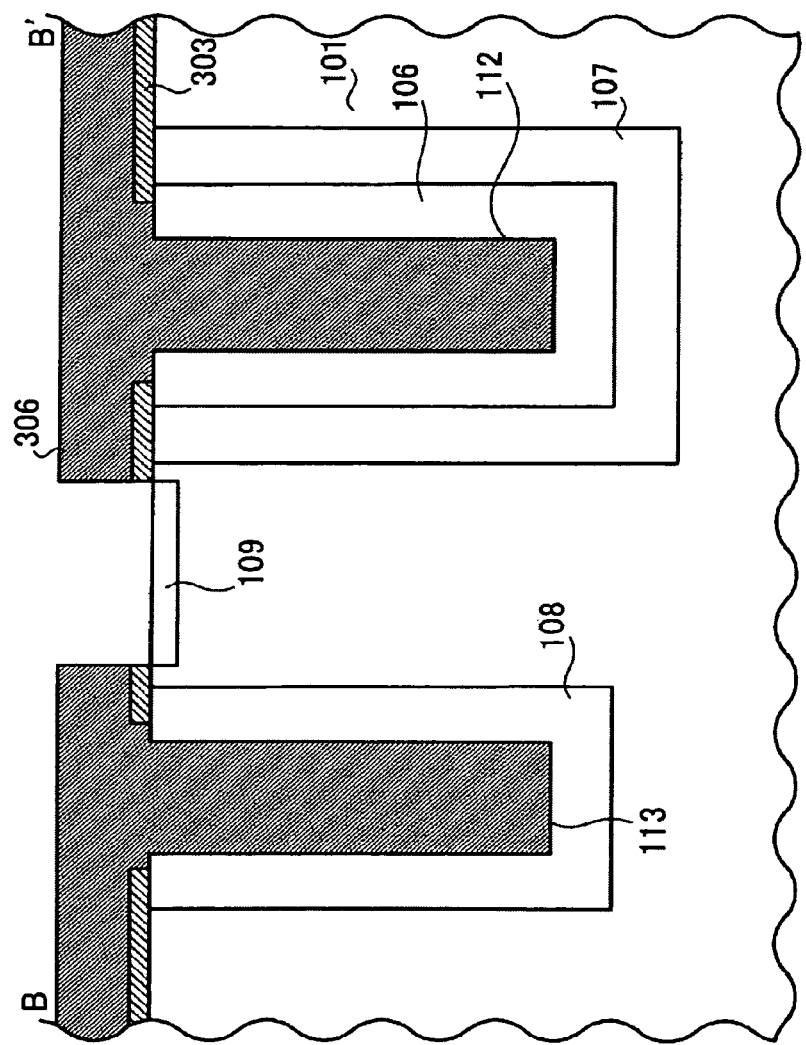
FIG. 11 is an explanatory diagram showing a still further stage of the semiconductor device manufacturing process.

Next, as shown in the A-A' cross-sectional view of FIG. 10, using the resist 305 as a mask, polysilicon oxide film 303 is removed from the interiors of the trenches 112 and 113 and from the periphery of the aperture portions thereof. Silicon oxide film 303 remaining within the trench 114 for the gate electrode 104 and on the periphery of the aperture portion thereof becomes the gate insulating film 105. And, using the resist 305 as a mask, n-type impurities are implanted into the trenches 112 and 113 from the perpendicular direction and from oblique directions. And, heat treatment is performed to form an $n^+$ drain region 106 and an $n^+$ source region 108. Then the resist 305 is removed.

Next, as shown in the B-B' cross-sectional view of FIG. 11, resist 306 is again deposited on the surface of the element formation region 101 and within the trenches 112 to 114. Patterning is performed to remove the resist 306 in the region in which a $p^+$ pickup region 109 is to be formed, and silicon oxide film 303 is further removed. Then, p-type impurities are implanted, and heat treatment is performed to form the $p^+$ pickup region 109. Then the resist 306 is removed.

Figure 12:
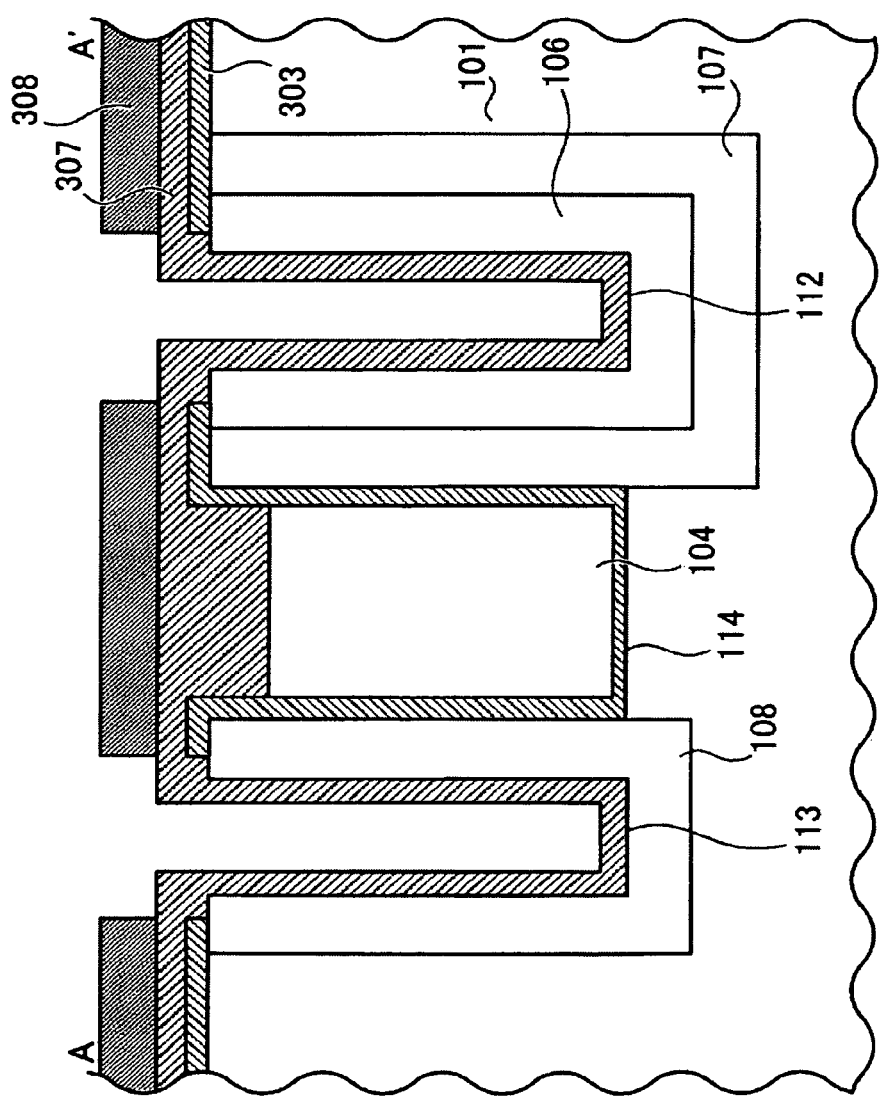
FIG. 12 is an explanatory diagram showing a still further stage of the semiconductor device manufacturing process.
Figure 13:
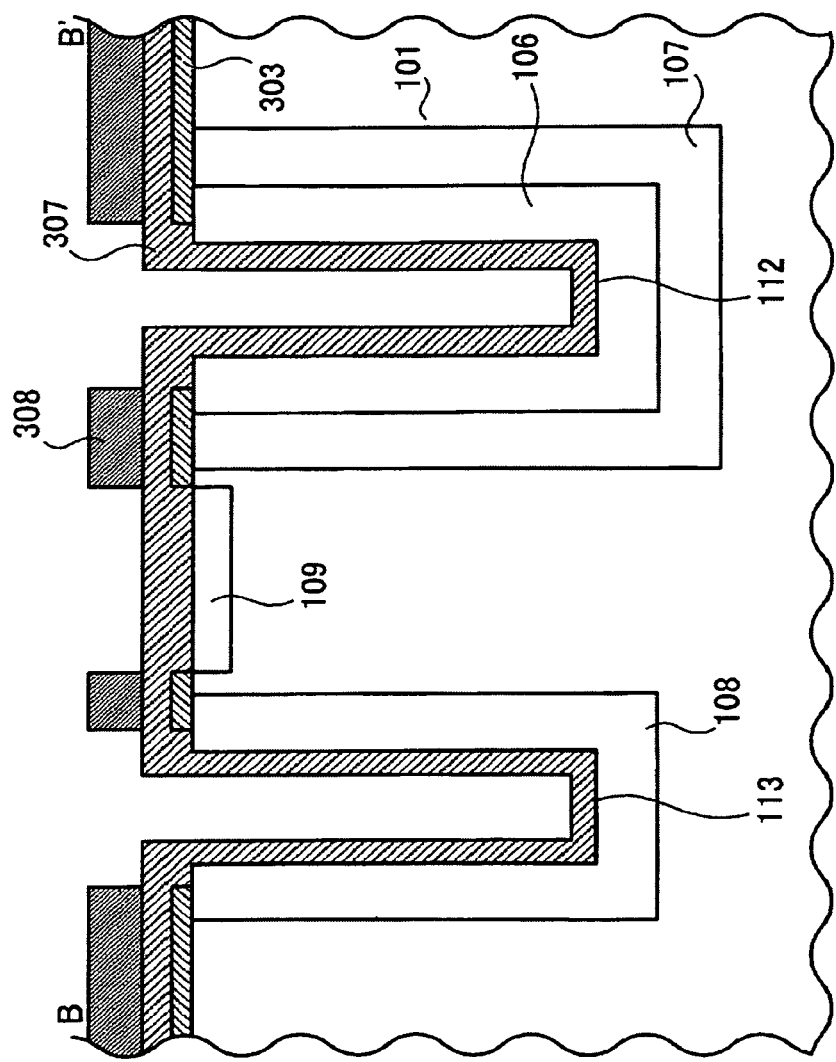
FIG. 13 is an explanatory diagram showing a still further stage of the semiconductor device manufacturing process.

Next, as shown in the A-A' cross-sectional view of FIG. 12 and the B-B' cross-sectional view of FIG. 13, silicon oxide film 307, to serve as an interlayer insulating film, is formed on the surface of the element formation region 101 and within the trenches 112 to 114. Resist 308 is deposited on the surface of the silicon oxide film 307, and patterning is performed to remove resist 308 from within the trenches 112 and 113 and the peripheries of the aperture portions thereof and from the surface of the $p^+$ pickup region 109.

Figure 14:
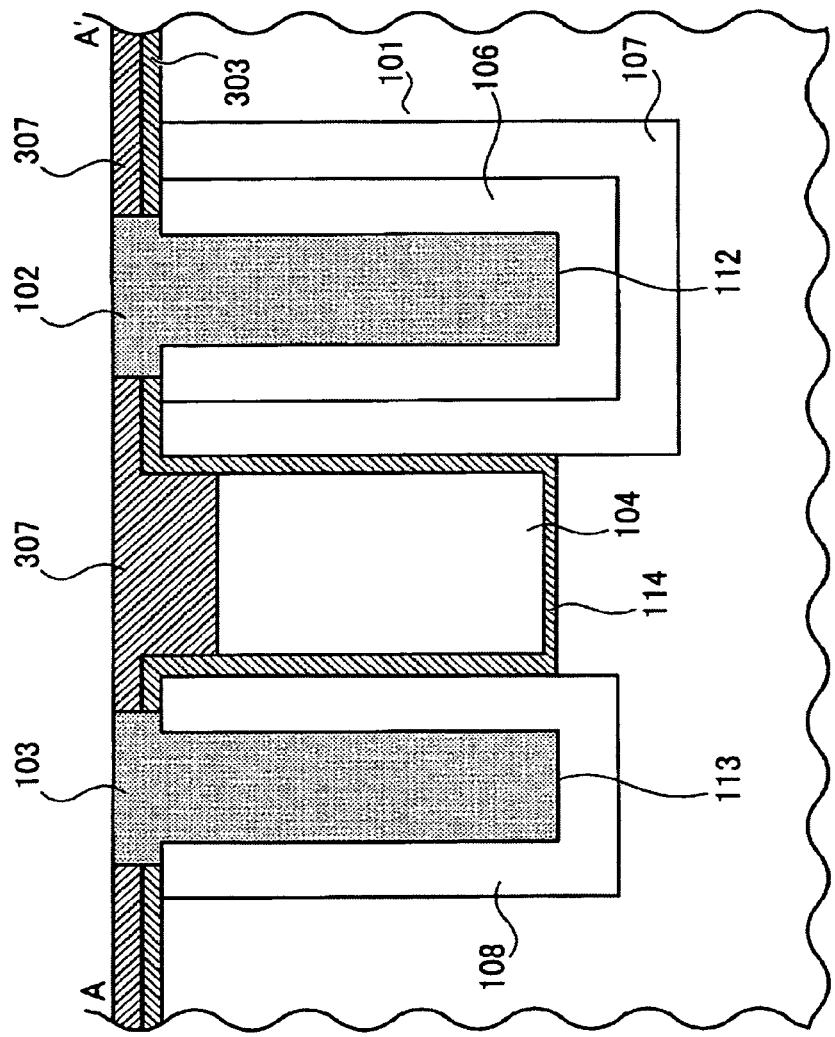
FIG. 14 is an explanatory diagram showing a still further stage of the semiconductor device manufacturing process.
Figure 15:
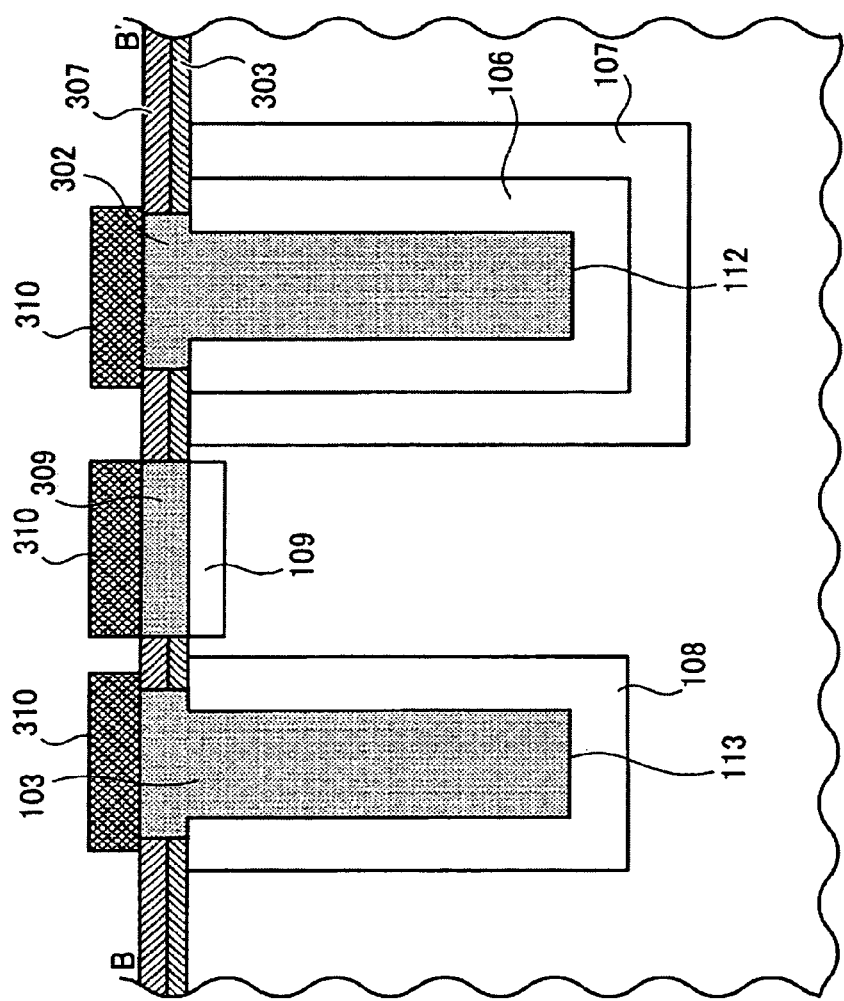
FIG. 15 is an explanatory diagram showing a still further stage of the semiconductor device manufacturing process.
Figure 16:
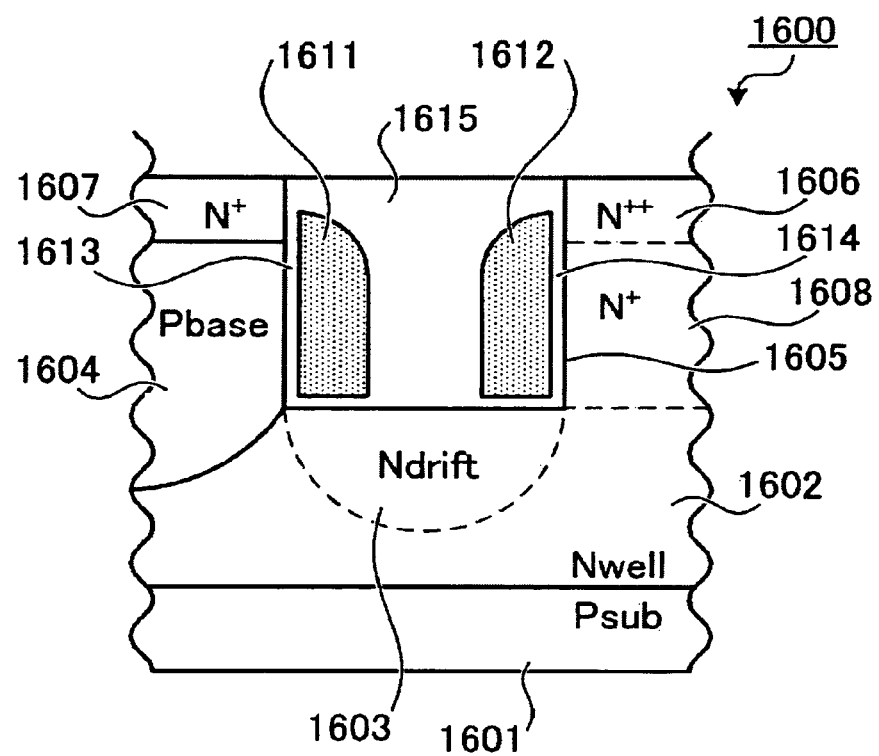
FIG. 16 is an explanatory diagram showing the cross-sectional structure of a conventional trench lateral power MOSFET.

Then, as shown in the A-A' cross-sectional view of FIG. 14 and the B-B' cross-sectional view of FIG. 15, the resist 308 is used as a mask to perform patterning, to remove silicon oxide film 307 from within the trenches 112 and 113 and the peripheries of the aperture portions thereof, and from the surface of the $p^+$ pickup region 109. Then, the resist 308 is removed, and the interiors of the trenches 112 and 113 and the peripheries of the aperture portions thereof are filled with tungsten or another metal, to form the drain electrode 102 and source electrode 103. Also, the surface of the $p^+$ pickup region 109 is also filled with tungsten or another metal to form a contact region 309. Then, aluminum is deposited over the entire surface, and patterning is performed to form aluminum wiring 310. By means of the above processes, a semiconductor device according to the invention can be manufactured.

As explained above, in a semiconductor device of this invention, by forming the MOS structure portion within the semiconductor substrate, the integration level with respect to the substrate surface area can be raised. Further, the device W length can be increased, so that the on resistance of the semiconductor device can be lowered.

Also, in a semiconductor device manufacturing method of this invention, by forming the trench for the gate electrode to be narrow compared with the trench for the drain electrode and the trench for the source electrode, polysilicon can be made to remain only in the trench for the gate electrode. By this means, the gate electrode can be formed of polysilicon, and the drain electrode and source electrode can be formed of metal.

Also, in a semiconductor device manufacturing method of this invention, by implanting impurities into the trench for the drain electrode and into the trench for the source electrode from the perpendicular direction and from oblique directions, a drain region and source region are formed in trench side walls. By this means, the high-concentration impurity regions which serve as the drain region and the source region can be formed uniformly, in self-aligned fashion, to below the polysilicon which serves as the gate electrode.

As explained above, a semiconductor device and a semiconductor device manufacturing method of this invention are effective for obtaining semiconductor devices with a low on resistance and high integration level with respect to the substrate surface area, and in particular are appropriate for MOSFETs with a three-dimensional structure, in which the MOS structure portion is formed in the direction perpendicular to the semiconductor substrate.

Several embodiments of the present invention are specifically illustrated and described herein. However, it will be appreciated that modifications and variations of the present invention are covered by the above teachings and within the purview of the appended claims without departing from the spirit and intended scope of the invention.

What is claimed is:
1. A semiconductor device, comprising:
   a first trench, provided in a semiconductor region of a first conduction type;
   a drain electrode, formed within the first trench;
   a second trench, provided in the semiconductor region of the first conduction type;
   a source electrode, formed within the second trench;

a third trench narrower than the first trench and second trench, provided in the semiconductor region of the first conduction type, and in contact with a drift region associated with the first trench and a source region associated with the second trench; and a gate electrode, formed within the third trench;

wherein the third trench is in contact with the drift region along a first wall of the third trench from a top edge of the drift region to a bottom edge of the third trench, and is in contact with the source region from a top edge of the source region to the bottom edge of the third trench;

wherein in a plan view a plurality of third trenches are arranged perpendicularly to both the first trench and the second trench, each of the plurality of third trenches having at least a third wall that begins at a point where a corresponding first wall is in contact with the drift region and ends at a point where a corresponding second wall is in contact with the source region, and wherein at least one third trench of the plurality of third trenches is separated from another third trench of the plurality of third trenches by an area of an element formation region, the area of the element formation region being bounded by a third wall of the at least one third trench, a third wall of the other third trench, the drift region and the source region, and the area of the element formation region including a pickup region.

2. The semiconductor device according to claim 1, wherein the second trench is parallel with the first trench.

3. The semiconductor device according to claim 1, wherein the source region is of a second conduction type, and formed on a periphery of the second trench.

4. The semiconductor device according to claim 1, wherein the gate electrode is formed of polysilicon, and the drain electrode and the source electrode are formed from metal.

5. The semiconductor device according to claim 1, further comprising a drain region of a second conduction type, formed on a periphery of the first trench.

6. The semiconductor device according to claim 5, wherein the drift region is of the second conduction type, is formed on the periphery of the drain region, and has an impurity concentration lower than that of the drain region.

7. The semiconductor device according to claim 1, wherein the pickup region is of the first conduction type, provided on a surface of the semiconductor region of the first conduction type, and removed from the drift region and the source region.

8. The semiconductor region according to claim 7, wherein a plurality of the gate electrodes and a plurality of the pickup regions are provided alternately.

9. The semiconductor device according to claim 7, wherein the pickup region is formed parallel to at least one third trench on a surface of the element formation region.

* * * * *